United States Patent
Merienne

(10) Patent No.: US 6,689,203 B2
(45) Date of Patent: Feb. 10, 2004

(54) LIQUID COATING COMPOSITION FOR PRODUCTION OF FLUORINE DOPED TIN OXIDE THIN LAYERS SUITABLE FOR CHEMICAL VAPOR DEPOSITION PROCESS

(76) Inventor: Gilles Merienne, 8 Rue du Pre Saint Jeah, Villemoisson sur Orge (FR), 91360

( * ) Notice: Subject to any disclaimer, the term of this patent is extended or adjusted under 35 U.S.C. 154(b) by 0 days.

(21) Appl. No.: 10/145,121

(22) Filed: May 15, 2002

(65) Prior Publication Data

US 2003/0035890 A1 Feb. 20, 2003

Related U.S. Application Data

(63) Continuation of application No. 09/557,772, filed on Apr. 25, 2000, now abandoned, which is a continuation of application No. 09/113,196, filed on Jul. 10, 1998.

(51) Int. Cl.$^7$ ............................ C23C 16/40; B32B 9/00; B32B 17/06
(52) U.S. Cl. .................. 106/282.19; 428/432; 428/696; 427/109; 427/126.3; 427/166; 427/255.35
(58) Field of Search ..................... 106/287.19; 428/432, 428/696; 427/109, 126.3, 166, 255.35

(56) References Cited

U.S. PATENT DOCUMENTS 4,590,096 A * 5/1986 Lindner ...................... 427/109

* cited by examiner

Primary Examiner—David Brunsman
(74) Attorney, Agent, or Firm—Oblon, Spivak, McClelland, Maier & Neustadt, P.C.

(57) ABSTRACT

Composition containing a chlorinated organotin derivative and a polyfluoroalkenyl compound and/or a halo polyfluoroalkenyl compound useful for CVD formation of fluorine doped tin oxide coatings.

20 Claims, No Drawings

...

LIQUID COATING COMPOSITION FOR PRODUCTION OF FLUORINE DOPED TIN OXIDE THIN LAYERS SUITABLE FOR CHEMICAL VAPOR DEPOSITION PROCESS

This is a continuation of Ser. No. 09/557,792 filed Apr. 25, 2000 now abandoned which is a continuation of Ser. No. 08/113,196 filed Jul. 10, 1998

BACKGROUND OF THE INVENTION

1. Field of the Invention

The present invention relates to new liquid coating compositions useful for the production of improved fluorine-doped tin oxide layers preferably made by chemical vapor deposition processes. Such coatings find use in insulating glass for houses, in conductive glass for plasma TV screens, etc. The obtained coatings, which also make up a part of the invention, have high conductivity, high visible light transmittance, and low haze.

2. Description of the Related Art

Fluorine-doped tin oxide coatings are known to be conductive layers. Several chemical compositions and methods of production have been described in the literature regarding the manufacture such tin oxide coatings:

Japanese patent 75-61,415 utilizes a spray of chemicals present in a large amount of solvent, which produces significant technical and environmental problems, and which is not usable in a C.V.D. (Chemical Vapor Deposition) process.

European patent EP-A-0 112 780 describes a method using alkyl chloro tin and a gaseous alkyl chloro fluorocarbon which provides severe problems with regard to toxic waste by-products as well as difficulties in handling and controlling the gas.

U.S. Pat. No. 4,265,974 describes a method using tetramethyl tin, which is very toxic and explosive in air.

U.S. Pat. No. 4,293,594 describes a method using dimethyl tin difluoride, which is a powder too difficult to be vaporized.

U.S. Pat. No. 4,601,917 describes a method using a chloro tin compound doped with an organic fluorine compound selected from trifluoroacetic acid, trifluoroacetic anhydride, ethyl trifluoroacetoacetate, trifluoroethanol, ethyltrifluoroacetate and pentafluoropropionic acid. The presence of an oxygenated functional group in the molecule of the fluorine dopant promotes the formation of oxidized build-up before pyrolysis on the glass.

U.S. Pat. No. 4,857,095 describes a method using dibutoxydibutyl tin with trifluoroacetic acid. The presence of oxygen bonded to tin prevents the good formation of the tin oxide layer and gives numerous white deposits in the fume evacuation circuit.

Japanese patent JP-A-62,70247 describes a method using dibutyl tin (or dimethyl tin) di-trifluoroacetate or butyl tin tri-trifluoroacetate with trichlorobutyl tin or tetrachloro tin. The presence of chlorinated solvent in all solutions renders the composition dangerous and toxic. Moreover, it promotes the appearance of corrosive green deposits in the fume evacuation circuit.

French patent 93-05245 describes a method using a chlorinated organo tin compound doped with organo tin monofluoroalkanoate and a tetraorgano tin. The use of such a heavy fluorine dopant promotes the appearance of black deposits in the vapor circuit due to the high temperature of vaporization needed.

From the above description of the prior art, the need for a new composition useful in a CVD process giving improved conditions of vaporization, avoiding environmentally toxic waste and giving high conductivity, high visible light transmittance coatings on, for example, glass, is clear.

SUMMARY OF THE INVENTION

In accordance with the invention, there is provided herein a new liquid coating composition very well adapted for use in the chemical vapor deposition of a coating on glass substrates which:

- provides a very conductive layer, with low haze and high visible light transmittance.
- has a low temperature of vaporization which avoids decomposition, keeping the vaporization circuit essentially free of deposit.
- does not require and preferably does not contain any dangerous or toxic component.
- upon pyrolysis avoids significant production of corrosive dust and environmental pollutants.

The invention composition comprises a chlorinated organotin derivative and a polyfluoroalkyl or halo polyfluoroalkyl dopant.

DETAILED DESCRIPTION OF THE INVENTION

More specifically, the composition of the invention preferably comprises a mixture prepared by mixing together:

70% to 99% by weight of at least one organo-tin compound, preferably chlorinated organo-tin compound, wherein the tin atom is bonded to at least one carbon atom of a hydrocarbon chain;

1% to 30% by weight of at least one polyfluoroalkyl, halo polyfluoroalkyl, polyfluoroalkenyl or halo polyfluoroalkenyl compound where "halo" is halogen other than fluorine (Cl, Br, etc.); and Optionally up to 29 weight percent of an organic solvent.

The preferred general formula of the organo-tin compound is:

$$R_x SnCl_{(4-x)} \qquad \text{Compound I}$$

wherein x is an integer which may vary from 1 to 4 (i.e., 1, 2, 3, 4) and R represents a $C_{1-8}$ alkyl or alkenyl group having one or more double bonds or a phenyl radical. Preferably, to avoid toxicological problems, R is a butyl radical. To limit the presence of carbon in the layer, x is preferably 1. These compounds are collectively referred to as (chlorinated) organotin compunds. The (chlorinated) organotin compound can also be a mixture of different compounds of the above formula.

The preferred general formula of the polyfluoroalkyl or alkenyl and halo polyfluoroalkyl or alkenyl compound is: $C_n F_m X_o H_p$, where n is at least 4 and preferably less than 25, m is 1–30, preferably 2 or greater, X is halogen other than fluorine, o is 0–30 and p is 0–52. When o is not zero the compound is a halo polyfluoroalkyl compound. When the carbon chain contains one or more double bonds the compounds are alkenyl compounds. These compounds are neutral organic compounds and include linear, branched and cyclic structures. The F, X and H atoms are substituents on the carbon atoms. For simplicity these alkyl and alkenyl compounds are described as (halo) polyfluoroalkyl compounds herein and preferably have boiling points of at least 50° C. and more preferably from 50–200° C.

One group of preferred species is:

Compound II:

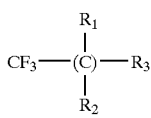

Where $R_1$, $R_2$ and $R_3$ are each independently hydrogen, halogen, $C_{2-9}$ alkyl or $C_{2-9}$ haloalkyl. The compound is a halo polyfluoroalkyl when any one or more of $R_1$, $R_2$ and $R_3$ are or contain halogen other than fluorine.

Preferably, compound II has a boiling point of from 50° C. to 200° C.

The polyfluoroalkyl or halo polyfluoroalkyl compound can also be a mixture of one or more of these different compounds. Both the polyfluoro and halo polyfluoro compounds may be present.

The composition according to the invention may also optionally comprise up to 29 weight % of an organic solvent such as xylene, methyl isobutyl ketone, dichloroethane, chloroform, $CCl_4$, etc. The solvent should preferably have a boiling point of 40 to 100° C. The solvent should be a liquid at STP. The organic solvent of the invention does not include the invention chlorinated organo-tin derivative, polyfluoroalkyl compound or halo polyfluoroalkyl compound.

The invention (chlorinated) organo tin compound, (halo) polyfluoro alkyl compound, and organic solvent are commercially available and/or within the skill of the ordinary artisan to obtain/synthesize.

The preferred way of producing a thin layer of fluorine doped tin oxide on a substrate with the invention composition is chemical vapor deposition. Useful substrates include glass, metal, etc. In this method, the invention liquid composition is vaporized in a continuous boiler at an effective temperature which temperature preferably is below 250° C. Then, the vapor can be mixed or carried out with oxygen, air (preferably hot air), and/or steam at a sufficient temperature to keep a complete vapor phase. The mixed vapor is directed on the substrate for pyrolysis. The temperature of the substrate must be higher than 400° C., preferably about (±20° C.)500° C. to 700° C.

With this method, a coating of fluorine doped tin oxide can be obtained having the following properties:

| | |
|---|---|
| Thickness: | 500Å to 9000Å, including 1000, 3000 and 5000Å |
| Sheet resistance: | 5–250 ohms/square including 15, 25, 50, 100 and 150 ohms/square |
| Visible light transmittance: | >70% such as >80%, >82%, >90%, etc. |
| Haze: | 0% to 20% such as less than 0.5% (light diffused/total light transmitted) |

Chemical vapor deposition processes are known to those of ordinary skill in the art, and the present invention method utilizing the invention composition is not limited to the example method specifically described.

DESCRIPTION OF THE PREFERRED EMBODIMENTS

In a preferred embodiment of the invention compound I is butyl tin trichloride ($BuSnCl_3$). Preferred species of halo polyfluoroalkyl and polyfluoroalkyl include one or more of the following species:

| | | |
|---|---|---|
| C4F9I | Perfluorobutyl iodide | Bp: 72° C. |
| C5F11I | Perfluoroisopentyl iodide | Bp: 89–90° C. |
| C6F14 | Perfluorohexane | Bp: 58–60° C. |
| C6F13H | 1H, Perfluorohexane | Bp: 71° C. |
| C6F13Cl | Perfluorohexyl Chloride | Bp: 84–86° C. |
| C6F13I | Perfluorohexyl Iodide | Bp: 115–117° C. |
| C7F16 | Perfluoroheptane | Bp: 80–85° C. |
| C7F13H | 1H, Perfluoroheptane | Bp: 96–97° C. |
| C7F15Br | Perfluoroheptyl Bromide | Bp: 118–119° C. |
| C7F15I | Perfluoroheptyl Iodide | Bp: 137–138° C. |
| C8F16 | Perfluoro-1,2-Dimethylcyclohexane | Bp: 102° C. |
| C8F18 | Perfluorooctane | Bp: 99–100° C. |
| C8F17H | 1H, Perfluorooctane | Bp: 110–112° C. |
| C8F17Br | Perfluorooctyl Bromide | Bp: 142° C. |
| C8F17I | Perfluorooctyl Iodide | Bp: 160–161° C. |
| C9F20 | Perfluorononane | Bp: 125–126° C. |
| C9F19Br | Perfluorononyl Bromide | Bp: 159° C. |
| C10F20 | Perfluorodecalin | Bp: 142° C. |

The invention compositions, which are within the skill of the ordinary artisan to make and use, preferably comprise (by weight) from 70% to 99% of the (chlorinated) organo tin compound such as compound I (including 75, 80, 85, 90 and 95%) and from 1% to 30% (including 5%, 10%, 15%, 20% and 25%) of the (halo) polyfluoroalkyl compound such as compound II. Solvent may be present in 29% or less, including 25%, 20%, 15%, 10%, 5%, greater than 0%, and 0%. compositions according to the invention may be prepared by mixing the necessary components together.

EXAMPLES

The Chemical Vapor Deposition installation and methodology described below was used to produce fluorine doped tin oxide thin films on glass substrates:

The invention composition is mixed and then pumped from a tank at a determined and regular flow rate, to a continuous boiler using a heating fluid at a fixed temperature of 225° C.

The vapor produced in the boiler leaves the boiler at a temperature of about 205° C. depending on the composition and the flow rate of the composition.

The vapor is then mixed with hot air and steam. The temperature of the final mixture is maintained at about 205° C.

This final gas mixture is then directed onto the surface of glass on a continuous production line of flat glass (float process).

The temperature of the glass during contact is between 400° C. and 700° C.

The following solutions were prepared by mixing together the listed ingredients in the indicated amounts (parts by weight). Solutions I, K and L must be agitated prior to use. The abbreviation MBTCL means mono butyl tin trichloride. MIBK is methyl isobutyl ketone.

| | | |
|---|---|---|
| A | Perfluoro n-Octyl Iodide | 11.7 |
| | MBTCL | 58.7 |
| | Xylene | 20.6 |
| B | Perfluoro n-Octyl Iodide | 4.9 |
| | MBTCL | 77.7 |
| | Xylene | 17.4 |

-continued

| | | |
|---|---|---|
| C | Perfluoro n-Butyl Iodide | 12.1 |
| | MBTCL | 84.9 |
| | MIBK | 3.0 |
| D | Perfluoro n-Butyl Iodide | 5.0 |
| | MBTCL | 95.0 |
| F | Perfluoro n-Hexyl Iodide | 4.9 |
| | MBTCL | 94.1 |
| | MIBK | 1.0 |
| G | Perfluoro n-Octyl Bromide | 2.36 |
| | MBTCL | 49.32 |
| | Dichloro ethane | 43.27 |
| | Chloroform | 5.05 |
| I | Perfluoro Hexane | 5.5 |
| | MBTCL | 82.0 |
| | Tetrachloro methane | 12.5 |
| K | Perfluoro Hexane | 10.0 |
| | MBTCL | 90.0 |
| L | Perfluoro Octane | 10.0 |
| | MBTCL | 90.0 |
| M | Perfluorohexyl-Iodide | 12.0 |
| | MBTCL | 85.0 |
| | MIBK | 3.0 |

The table below gives the different parameters used in the C.V.D. laboratory installation for 12 tests:

| | Gas flow | Gas temp. | Air flow | Water flow |
|---|---|---|---|---|
| Solution G | 0.825 L/mn | 203° C. | 60 cfm | 0.230 L/mn |
| Solution F | 0.680 L/mn | 204° C. | 60 cfm | 0.205 L/mn |
| Solution K | 0.860 L/mn | 205° C. | 60 cfm | 0.240 L/mn |
| Solution L | 0.640 L/mn | 204° C. | 60 cfm | 0.190 L/mn |
| Solution F | 0.820 L/mn | 204° C. | 60 cfm | 0.225 L/mn |
| Solution F | 0.580 L/mn | 206° C. | 60 cfm | 0.185 L/mn |
| Solution A | 0.700 L/mn | 202° C. | 60 cfm | 0.210 L/mn |
| Solution B | 0.575 L/mn | 204° C. | 60 cfm | 0.190 L/mn |
| Solution C | 0.850 L/mn | 205° C. | 60 cfm | 0.235 L/mn |
| Solution C | 0.630 L/mn | 206° C. | 60 cfm | 0.200 L/mn |
| Solution D | 0.880 L/mn | 205° C. | 60 cfm | 0.250 L/mn |
| Solution D | 0.540 L/mn | 208° C. | 60 cfm | 0.180 L/mn |

The table below gives the parameters used in the pilot test CVD installation.

| Solution | Test | Chemical flow | Water flow | Air flow | Vapor temp. |
|---|---|---|---|---|---|
| M | 1 | 0.450 L/mn | 0.073 L/mn | 80 cfm | 150° C. |
| M | 2 | 0.724 L/mn | 0.147 L/mn | 90 cfm | 170° C. |
| M | 3 | 0.870 L/mn | 0.176 L/mn | 80 cfm | 190° C. |

The table below gives the film characteristics and performances measured on the coated glass for laboratory tests.

| | Film thickness | Sheet resistance | Visible transmittance | Haze |
|---|---|---|---|---|
| Test 1 | 3600 Å | 23 ohm2 | 80% | 0.6 |
| Test 2 | 2800 Å | 22 ohm2 | 83% | 0.4 |
| Test 3 | 4200 Å | 22 ohm2 | 79% | 0.6 |
| Test 4 | 2850 Å | 21 ohm2 | 84% | 0.4 |
| Test 5 | 4300 Å | 19 ohm2 | 80% | 0.5 |
| Test 6 | 2800 Å | 18 ohm2 | 83% | 0.3 |
| Test 7 | 2900 Å | 23 ohm2 | 83% | 0.3 |
| Test 8 | 2700 Å | 21 ohm2 | 85% | 0.2 |
| Test 9 | 4300 Å | 20 ohm2 | 82% | 0.4 |
| Test 10 | 2900 Å | 19 ohm2 | 84% | 0.3 |

-continued

| | Film thickness | Sheet resistance | Visible transmittance | Haze |
|---|---|---|---|---|
| Test 11 | 4600 Å | 21 ohm2 | 82% | 0.5 |
| Test 12 | 2800 Å | 17 ohm2 | 85% | 0.2 |

The Table below gives the film characteristics and performances from the coated glass produced using the pilot CVD installation.

| Solution | Test | Film thickness | Sheet resistance in ohms per square | Visible transmittance | Haze | Emissivity |
|---|---|---|---|---|---|---|
| M | 1 | 2300 Å | 31.6 | 83.2% | 0.3% | 0.2 |
| M | 2 | 2600 Å | 30 | 84.6% | 0.4% | 0.2 |
| M | 3 | 2700 Å | 24.6 | 85.2% | 0.6% | 0.2 |

Performances given in the Tables above were measured with a Pacific Scientific Hazeguard XL-211, Perkin-Elmer Lamda-19 with integrating sphere, GE XRD-6 wavelength disperse x-ray, Perkin Elmer 983-G spectro photometer and four point probe.

Obviously, numerous modifications and variations of the present invention are possible in light of the above teachings. It is therefore to be understood that within the scope of the appended claims, the invention may be practiced otherwise than as specifically described herein.

What is claimed is:

1. A composition comprising:
    70–99% by weight of at least one (chlorinated) organotin compound, 1–30% by weight of at least one (halo) polyfluoroalkenyl compound, and optionally an organic solvent.

2. The composition of claim 1, wherein said at least one (chlorinated) organotin compound is a compound of the formula

$$R_xSnCl_{(4-x)}$$

wherein x is an integer of 1–4 and R is a $C_{1-8}$ alkyl or alkenyl group, or a phenyl radical.

3. The composition of claim 2, where R is butyl and X is 1.

4. A method of preparing a fluorine-doped tin oxide film on a substrate, comprising contacting a hot substrate with the composition of claim 3 in the vapor state, wherein said substrate is at a temperature of ≧400° C.

5. A fluorine-doped tin oxide film prepared according to the method of claim 4.

6. The method of claim 4, wherein said film has a thickness of 500 to 9000 Å, a sheet resistance of 5–250 ohms/square, greater than 70% visible light transmittance and 0 to 20% haze measured as light defused/total light transmitted.

7. The method of claim 4, wherein said film has a thickness of 500 to 9000 Å, a sheet resistance of 5–250 ohms/square, greater than 70% visible light transmittance and 0 to 20% haze measured as light defused/total light transmitted.

8. A method of preparing a fluorine-doped tin oxide film on a substrate, comprising contacting a hot substrate with the composition of claim 2 in the vapor state, wherein said substrate is at a temperature of ≧400° C.

9. A fluorine-doped tin oxide film prepared according to the method of claim 8.

10. The method of claim 9, wherein said film has a thickness of 500 to 9000 Å, a sheet resistance of 5–250 ohms/square, greater than 70% visible light transmittance and 0 to 20% haze measured as light defused/total light transmitted.

11. The method of claim 8, wherein said first has a thickness of 500 to 9000 Å, a sheet resistance of 5–250 ohms/square, greater than 70% visible light transmittance and 0 to 20% haze measured as light defused/total light transmitted.

12. The composition of claim 1, wherein said at least one (halo) polyfluoroalkenyl compound has the following formula:

$$C_nF_mX_oH_p$$

where n is 4–25, m is 1–30, o is 0–30, p is 0–52, and X is halogen other than fluorine.

13. The composition of claim 12, wherein n is 4 to less than 25 and m is 2–30.

14. The composition of claim 1, comprising organic solvent.

15. A method of preparing a fluorine-doped tin oxide film on a substrate, comprising contacting a hot substrate with the composition of claim 1 in the vapor state, wherein said substrate is at a temperature of $\geq 400°$ C.

16. A fluorine-doped tin oxide film prepared according to the method of claim 13.

17. The film of claim 16, wherein said film has a thickness of 500 to 9000 Å, a sheet resistance of 5–250 ohms/square, greater than 70% visible light transmittance and 0 to 20% haze measured as light defused/total light transmitted.

18. The method of claim 15, wherein said film has a thickness of 500 to 900 Å, a sheet resistance of 5–250 ohms/square, greater than 70% visible light transmittance and 0 to 20% haze a slight defused/total light transmitted.

19. The composition of claim 1, comprising an organic solvent in an amount up to 29 weight %.

20. The composition of claim 1, wherein said at least one (halo) polyfluoroalkenyl compound has a linear, branched or cyclic structure.

* * * * *